United States Patent [19]

Spitzer et al.

[11] Patent Number: 5,075,763
[45] Date of Patent: Dec. 24, 1991

[54] HIGH TEMPERATURE METALLIZATION SYSTEM FOR CONTACTING SEMICONDUCTOR MATERIALS

[75] Inventors: Mark B. Spitzer, Sharon; Jason E. Dingle, North Attleboro, both of Mass.

[73] Assignee: Kopin Corporation, Taunton, Mass.

[21] Appl. No.: 559,406

[22] Filed: Jul. 23, 1990

Related U.S. Application Data

[63] Continuation of Ser. No. 250,388, Sep. 28, 1988, abandoned.

[51] Int. Cl.$^5$ .................... H01L 31/06; H01L 29/40
[52] U.S. Cl. .................................. 357/71; 357/56; 357/30; 357/67; 357/69
[58] Field of Search .................. 357/30, 56, 71, 67, 357/69

[56] References Cited

U.S. PATENT DOCUMENTS

| | | | |
|---|---|---|---|
| 3,878,553 | 4/1975 | Sirles et al. | 357/56 |
| 3,890,170 | 6/1975 | Russ | 357/56 |
| 4,547,622 | 10/1985 | Fan et al. | 136/249 |
| 4,575,576 | 3/1986 | Ludowise | 357/30 |
| 4,632,712 | 12/1986 | Fan et al. | 148/175 |
| 4,748,485 | 5/1988 | Vasudev | 357/23.7 |

OTHER PUBLICATIONS

"Ohmic Contacting Schemes to Gallium Arsenide Devices", California Institute of Technology, Contractor Report SAND87-7010, pp. 1-48 (Aug. 1987).
Sze, *Physics of Semiconductor Devices*, J. Wiley & Sons, N.Y. 1981, pp. 432-439.
*IBM TDB*, vol. 20, No. 6, Nov. 1977, "Metallurgies... Metal/GaAs Junctions", Ho et al.
"Thermal Degradation Mechanisms in GaAs Solar Cells with High-Temperature Contacts", Tobin et al., 9/30/88.
*19th IEEE Photovoltaic Spec. Conference*, "Advanced Metallization For Highly Efficient Solar Cells", Tobin et al., 1987.
*J. Vac. Sci. Technol.*, 19(3), "Diffusion Barriers in Layered Contact Structures", Nicolet and Bartur, Sep.-/Oct. 1981, pp. 786-793.
*J. Vac. Sci. Technol. A.*, vol. 3, No. 6 "Tib$_2$ and ZrB$_2$ Diffusion Barriers in GaAs Ohmic Contact Technology", Shappirio et al., Nov./Dec. 1985, pp. 2255-2258.
"High Temperature Contact Metalization For Advanced Solar Cells", Horne et al., Aug. 1984, pp. 1-64.
*Contractor Report*, "Development of Metallization for GaAs and AlGaAs Concentrator Solar Cells", by Tobin, Apr. 1987, pp. 1-104.
*18th IECEC*, "High Temperature Solar Cells For Space Power Applications", by Geis et al., 1983, pp. 1219-1223.

*Primary Examiner*—Jerome Jackson, Jr.
*Attorney, Agent, or Firm*—Hamilton, Brook, Smith & Reynolds

[57] ABSTRACT

A metallization system for contacting semiconductor materials employed in high temperature applications that is thermally stable. The system can be utilized in the fabrication of electronic devices such as diodes, lasers, transistors, solar cells, and integrated circuits comprised of such devices.

10 Claims, 7 Drawing Sheets

HIGH TEMPERATURE METALLIZATION SYSTEM FOR CONTACTING SEMICONDUCTOR MATERIALS

This is a continuation of co-pending application Ser. No. 07/250,388 filed on Sept. 28, 1988 now abandoned.

BACKGROUND

The present invention relates to structures and methods for providing electrical contacts to surfaces of semiconductor materials, and in particular, to thermally stable metallization systems for contacting photovoltaic devices. The continuing development of semiconductor devices, and of photovoltaic devices in particular, has resulted in various methods for optimizing the efficiency and lifetime of devices operating at elevated temperatures. For example, photovoltaic devices are often used in space applications where thermal and radiation damage due to the environment can severely reduce device lifetime and efficiency.

The interdiffusion of the material used as an electrical conductor with the photoactive surface of photovoltaic devices from which current is collected has resulted in the development of diffusion barrier schemes to control the instability of adjacent layers. This interdiffusion, resulting in the breakdown of the structure and loss of efficiency, is particularly deleterious in devices exposed to high temperatures. A large number of electronic and optoelectronic devices, including photovoltaic cells, are designed to operate at temperatures in the range of $-100°$ C. to $100°$ C. However, hostile environmental factors require the devices to endure occasional temperature elevation up to or exceeding $700°$ C. Even if these temperature excursions are limited to periods of several minutes, the aforementioned interdiffusion of the semiconductor and metal system is highly deleterious.

Therefore, there exists a need for the development of thermally stable metallization systems employing barriers to prevent the interdiffusion of conductive metal and the semiconductor materials from which current is collected.

Many nitrides, borides, and carbides of transition metals have been suggested for use as diffusion barriers with silicon. The use of barriers to prevent the diffusion of an overlying conductive layer into an ohmic contact metallized layer on GaAs wafers has been explored in an effort to improve the survivability of such metallized photovoltaic devices at temperatures up to $700°$ C.

The grid pattern used in photovoltaic devices contains several loss mechanisms which reduce the available power output. It is desirable to reduce the grid area as the grid blocks out light that would otherwise enter the cell. This factor must be balanced against ohmic losses that are reduced with greater area coverage by the grid contact.

Even with the many known device improvements, photovoltaic structures continue to suffer efficiency losses due to mechanical and thermal stresses encountered at elevated temperatures. Cells using compound semiconductors in particular, lose their structural and chemical integrity due to decomposition, especially at the higher operating temperatures.

SUMMARY OF THE INVENTION

The present invention relates to metallization systems for electrically contacting the surfaces of semiconductor materials employed in the fabrication of electronic devices such as diodes, lasers, LEDs, transistors, solar cells, and integrated circuits composed of such devices. The following metallization system provides a highly stable grid pattern suitable for applications in which components are subjected to substantial thermal and mechanical stresses. Such applications necessitate that not only the front-side contacts, but also that the back-side contacts, be capable of enduring the high temperature excursions.

In one embodiment, contacts to the n-type emitter and p-type base (or conversely, the p-type emitter and n-type base) are made on the same side of the device. For all embodiments, for either n-on-p and p-on-n junction structures, the metal systems appropriate for surfaces of each conductivity type must be employed, whether or not the p- and n-type contacts are formed on the same or opposite sides of the device.

Semiconductor devices are usually contacted at the base by the deposition of a conductive layer or film. However, where the base of a device such as a solar cell experiences thermal fluctuations the back contact can degrade and malfunction due to the diffusion or interaction with the semiconductor material. Such diffusion from the back contact can also adversely affect the active junction of the device, particularly in devices composed of gallium arsenide in which the migration of arsenic can reduce the lifetime of the device. Such a back contact structure can also be employed with other so-called III-V and II-VI compound semiconductor materials. Thus, in high temperature photovoltaic systems, both the front and back contacts to the device must isolate the current carrying conductor from the semiconductor surface with which it is normally electrically active.

A preferred embodiment of the system comprises a conductive contact layer positioned on a highly doped semiconductor surface that forms a low resistance ohmic contact to the surface. The non-rectifying ohmic contact is not generally used to carry large amounts of current off the surface. A diffusion barrier layer is then formed over the ohmic contact to inhibit interdiffusion between the semiconductor material and the conduction layer formed over the barrier layer. The conduction layer is in conductive contact with the semiconductor surface via the underlying layers, and is secured to the diffusion barrier with an adhesion layer to improve the mechanical strength of the system. An additional layer of metal can be positioned between the semiconductor and the diffusion barrier in applications where a two component system can improve the ohmic contact and overall thermal stability.

A preferred embodiment of the invention employing gallium arsenide uses a refractory metal contact layer having a thickness of about 5000 Å, a diffusion barrier layer comprised of TiN, TiWN, WN or TaN, a titanium, tantalum or similar material for an adhesion layer, and an Al, Cu, Au, Ni, Pt or Ag conduction layer for contacting n-type gallium arsenide. An additional platinum layer can be positioned between the contact layer and a p-type gallium arsenide surface to provide an improved ohmic contact. Note that the exposed surfaces of the device, except for the contact pads, are encapsulated to prevent the outdiffusion of arsenic, particularly at high temperatures. An encapsulant such as silicon nitride also serves as an antireflection coating.

This system can be employed as the back contact for a photovoltaic device where the conduction layer serving as the principal current carrying element of the contact system is separated from the back surface of the device by a diffusion barrier. The back metallization may cover the entire junction area of the device, or it can be patterned in a grid if it is desired to transmit nonabsorbed wavelengths through the device. Such a patterned back contact would be employed in a tandem cell configuration.

In many applications the conduction layer continuously extends off the edge of the mesa. However, for devices in which a contact grid must be provided over surfaces having non-planar regions or steps and where the principal current carrying conductor of the grid must be isolated from the semiconductor, the following grid design can be employed. Interdiffusion can occur between the conductor and the semiconductor due to defects in the barrier that occur at the steps. This diffusion can be prevented using a patterned conductor that extends up to, but not over the non-planar portion of the surface. The current is carried between the portions of the conductor on opposite sides of the step in the surface using the underlying conductive contact layer and/or the diffusion barrier layer that extends over the discontinuity in the surface.

The above and other features of the invention including various novel details of construction and combination of parts will now be more particularly described with reference to the accompanying drawings and pointed out in the claims. It will be understood that the particular high temperature metallization systems embodying the invention are shown by way of illustration only and not as a limitation of the invention. The principles and features of this invention may be employed in varied and numerous embodiments without departing from the scope of the invention.

DETAILED DESCRIPTION OF THE INVENTION

Figure 1A:
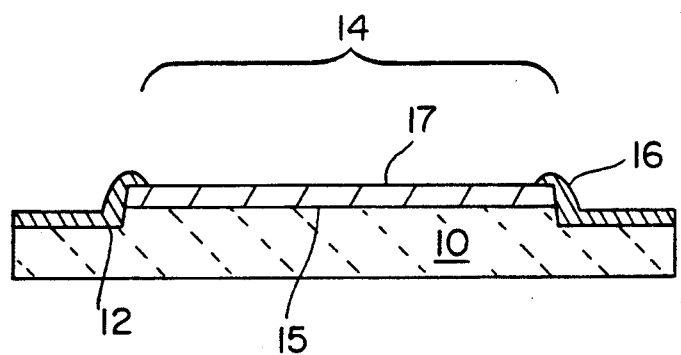
FIGS. 1A-1E schematically illustrate the fabrication steps for a preferred metallization system of the present invention.
Figure 1B:
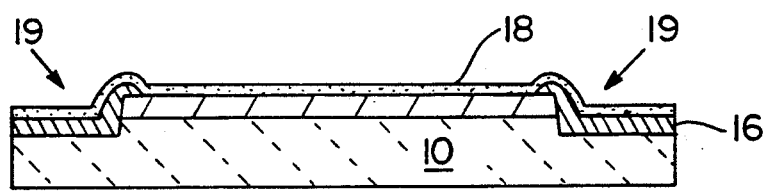
Figure 1C:
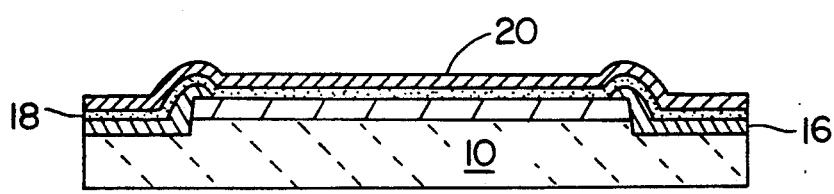
Figure 1D:
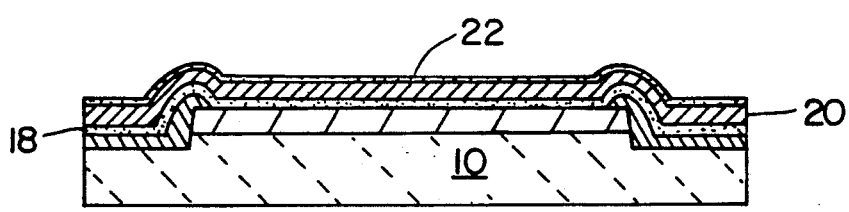

A method of making the contact metallization system of the present invention is illustrated in FIGS. 1A-1E. The metallization system is employed on photovoltaic devices that are intended for use in thermally stressful environments in which materials such as gallium arsenide (GaAs) are known to degrade unless properly isolated.

A preferred embodiment of the method uses a wafer 10 of suitably doped GaAs that is first prepared with an appropriate diode structure 15. The top surface 17 of the structure is highly doped having concentrations in excess of $5 \times 10^{18} cm^{-3}$. The wafer 10 is then patterned with photoresist and etched to a depth below the junction 12 to form a mesa 14, and an insulator 16 is formed along the outer rim of the mesa.

A conductive contact layer 18 is then formed over the mesa surface and extends over the insulator to cover an area 19 beyond the mesa edge. This contact layer 18 forms a low resistance non-rectifying ohmic contact with the semiconductor surface. A diffusion barrier 20 is then deposited over the surface of the contact layer 18. An adhesion layer 22 is then deposited on the barrier layer 20 that is used to secure a conduction layer 24 to the barrier layer 20. The different layers 18, 20, 22 and 24 are comprised of materials such that the conduction layer is in conductive contact with the semiconductor surface to provide for the efficient collection of current from the photo-active surface of the device.

A preferred embodiment of the invention utilizes molybdenum, platinum, tungsten or other refractory metals for the contact layer having a thickness of about 5000 Å. The diffusion barrier is preferably comprised of titanium nitride (TiN), titanium tungsten nitride (TiWN), tungsten nitride (WN) or tantalum nitride (TaN) and has a thickness of about 1000 Å. This barrier layer prevents the interdiffusion of material between the conduction layer and the gallium arsenide wafer. As the conduction layer must normally support a high current flow, it is typically comprised of gold, silver, copper or aluminum. As these materials are electrically active in semiconductors such as silicon and gallium arsenide, any diffusion thereof into the wafer at the high temperatures to which the system is exposed would greatly reduce the lifetime of the device. The adhesion layer preferably comprises about 500 Å of titanium, tantalum or other transition metals or materials having suitable adhesive characteristics.

Note that the system can be patterned to form a grid structure using standard photolithographic and deposition techniques known in integrated circuit manufacturing.

Figure 2A:
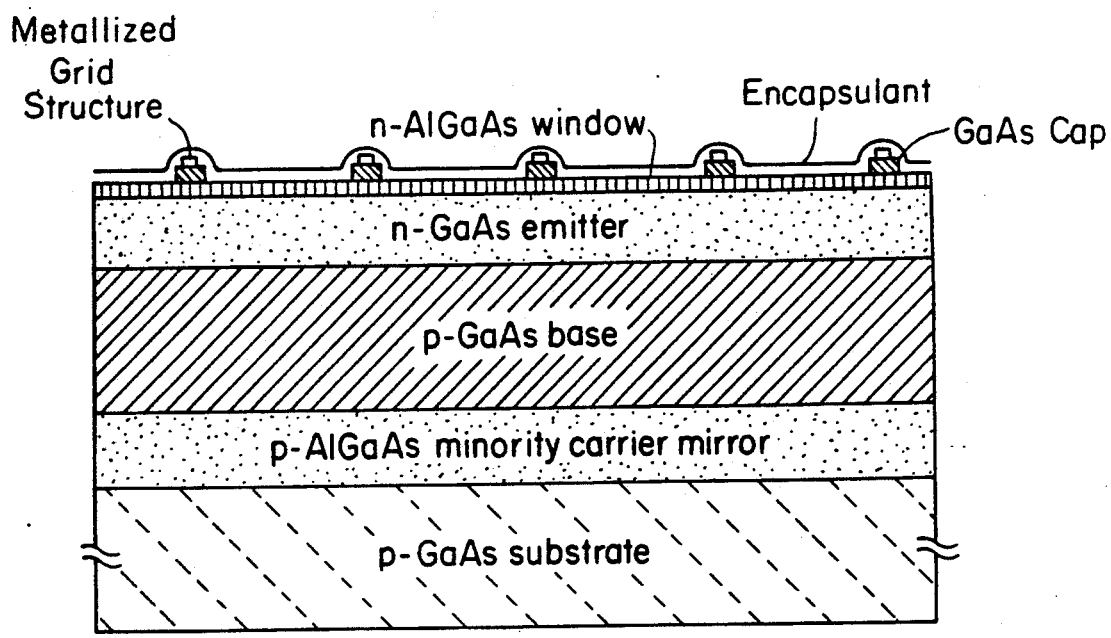
FIG. 2A shows a cross-sectional view of a GaAs double hetero-structure that is employed in the fabrication of solar cells using the present metallization system.

The metallization system can be used with a cell design which comprises a GaAs double hetero-structure shown in FIG. 2A. The design consists of a buried p-type AlGaAs minority carrier mirror in the base that acts to improve red response and $V_{oc}$, upon which is grown a conventional GaAs p/n junction, and an n-type AlGaAs window layer. These layers are grown epitaxially by organometallic chemical vapor deposition upon standard GaAs substrates. This structure has been used for both the standard and high temperature cells. Note the use of a cap layer placed between the n-AlGaAs window and the grid structure.

Figure 2B:
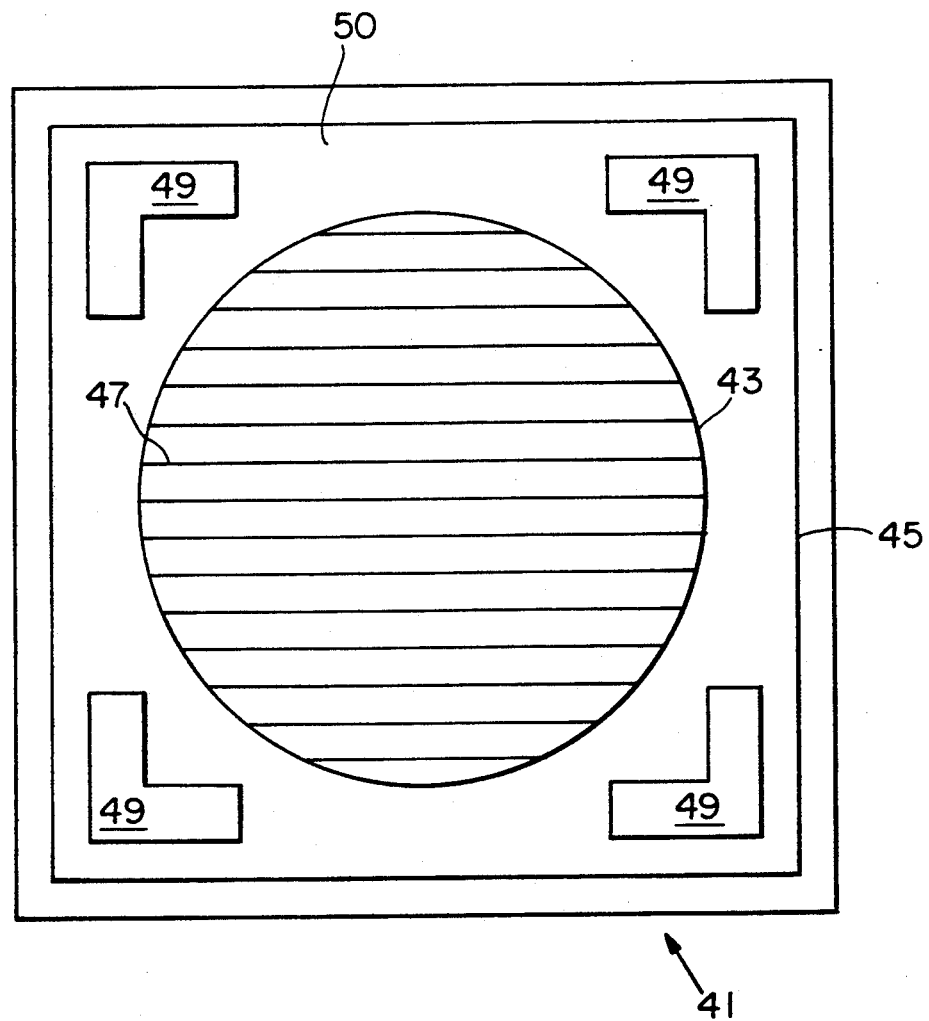
FIG. 2B shows a top view of a concentrator cell employing the metallization system of the present invention.

FIG. 2B shows a top view of the cell structure having the metallized grid structure 47 that extends over the edge 43 of the mesa into a conductive layer 50 that covers almost the entire area on the front side off-mesa portion of the device 41. Within the edge 45 of this metallized area are a plurality of contact pads 49 that are in conductive contact with the off-mesa metallization and thus the grid 47. The pads 49 may be comprised of the same or different materials than the conduction layer, and can be bonded to the conduction material with a bonding layer.

Figure 3:
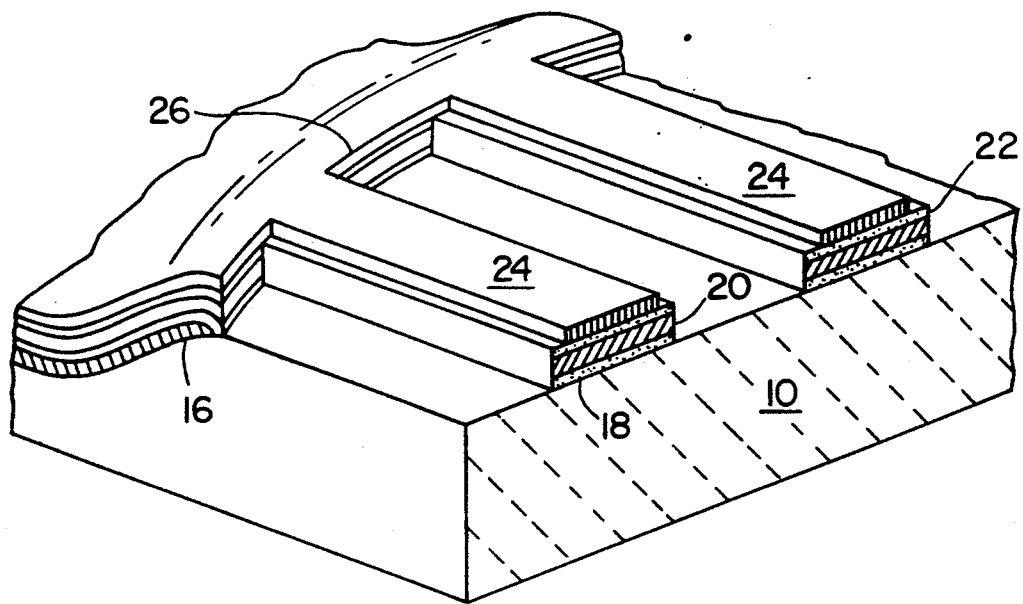
FIG. 3 schematically illustrates in a perspective view, a grid structure having the metallization system.

FIG. 3 illustrates the finished grid after formation and patterning of each layer. Note that the conductive grid 24 extends off the mesa at wall 26 and that a portion of the insulator 16 is positioned at the base of the wall 26 at the edge of the mesa. Note also that all of the layers 18, 20, 23 and 24 extend off the mesa and that the entire surface is then encapsulated as shown in FIG. 2A.

Figure 4:
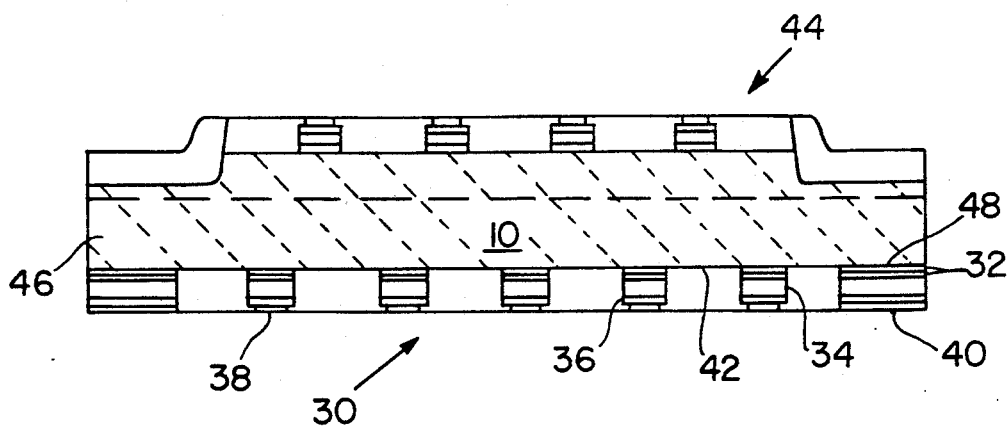
FIG. 4 illustrates in a cross sectional view the metallization system employed as a back contact for a photovoltaic device.

FIG. 4 illustrates a further application of the metallization system wherein a back contact 30 is provided at the base layer 46 of a photovoltaic device wherein the ohmic contact serves to bond the contact to the device.

Existing back contact systems have normally consisted of simple conductive grids or layers. However, in high temperature environments the back contact to such a photovoltaic device becomes more critical. Just as the principal current carrying conductor of the front contact grid must be isolated from the junction due to the adverse effects of interdiffusion, the back conductor must also be isolated from the semiconductor surface from which current is being collected. Thus, FIG. 4 shows in a cross-sectional view the front 44 and back 30 contact grid design employing a diffusion barrier 34 on the back contact to prevent diffusion of the conductor into the semiconductor surface 42. In this particular embodiment where the base 46 of the device is a p+-type material an additional metallic layer 48 is used between the conduction layer 32 and the semiconductor surface 42 to provide a thermally stable ohmic contact. Platinum is used for layer 48 having a thickness of about 500 Å thereby providing a stable contact over the temperature range of 500° C. to 900° C. Contact pads are located on the peripheral surface 40 to provide external electrical connections to the conduction grid elements 38. The entire back surface of the device is coated with an encapsulation layer (not shown) except for small openings on the contact pads.

Figure 5:
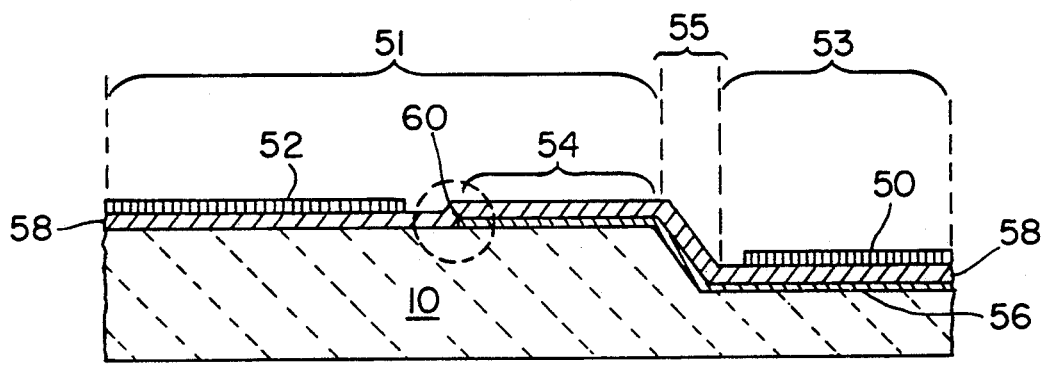
FIG. 5 illustrates in a cross sectional view a metallization system for non-planar grid contacts to semiconductor devices.
Figure 5A:
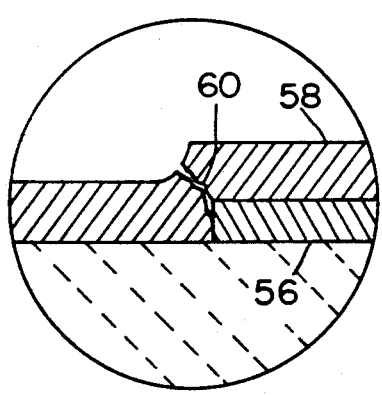
FIG. 5A is an enlarged cross-sectional view illustrating a microcrack extending through a diffusion barrier.

A further embodiment shown in FIG. 5 pertains to the above need to separate Au or similar conduction materials from the semiconductor. In particular, it relates to the case in which the diffusion barrier 58 is formed over a non-planar surface 54 or step 55. Such a step is formed by surface features such as the patterned dielectric or insulating layer 56 that are necessary to separate electrical layers in a solar cell or transistor. In theory, the diffusion barrier perfectly covers such steps, but in practice the diffusion barrier sometimes has a microcrack 60 at the step, or even may be discontinuous, owing to the deposition process. Such a crack 60 is shown in the enlarged view of FIG. 5A, where the crack 60 provides a path for migration of material through the barrier to the semiconductor substrate 10. Therefore, it is necessary, not just to prevent contact between the conduction metal and the semiconductor at these regions, but also to prevent enhanced diffusion through cracks, microcracks, or grain boundaries.

A pattern is imposed upon the conduction metal to remove it from regions that include such steps. For example, a solar cell or transistor may have a region of the front surface that is protected by a dielectric insulation layer. It is necessary for the contact system to carry current over this region, thus requiring that the system extend over any steps on the semiconductor surface as shown in FIG. 4. The conductor is patterned into separate portions 50 and 52 to extend up to the opposite sides of the step. In such a case, the current is carried over the step by the diffusion barrier or ohmic contact metal contained in layer 58. The defects that occur in this layer are generally small enough to permit the conduction of current through the layer 58. The distance between the conductive portions 50 and 52 introduces negligible resistance, as long as the distance is small, that is, preferably less than 100 microns. As a result of this structure, any defects in the diffusion barrier occurring in the immediate vicinity of the step will not result in the exposure of the conductor material to the semiconductor surface. Note that a further conductive portion can be formed over the planar area 54 to shorten the distance that current must travel through the layer 58.

Figure 1E:
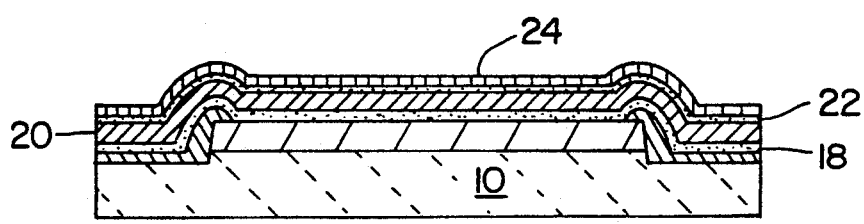
Figure 6:
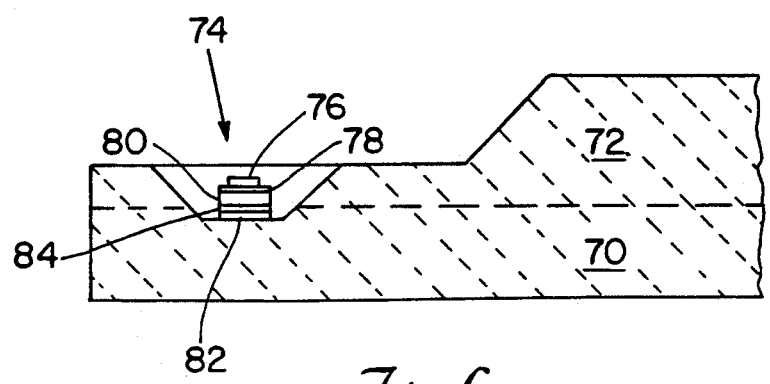
FIG. 6 illustrates in a cross-sectional view a preferred system for contacting the base of a photovoltaic device.

A further system for contacting the base of a photovoltaic device is shown in FIG. 6. In this embodiment, a portion of the top off-mesa area of the device is removed to expose the base 70 of the device around the perimeter of the mesa. In particular, a well 74 is etched and the contact structure illustrated in FIG. 1E is then formed inside the well including ohmic contact layer 82, tungsten layer 84, diffusion barrier 80, adhesion layer 78 and conduction layer 76. The well is sufficiently deep to insure good electrical contact with the base layer 70 of the device.

Figure 7:
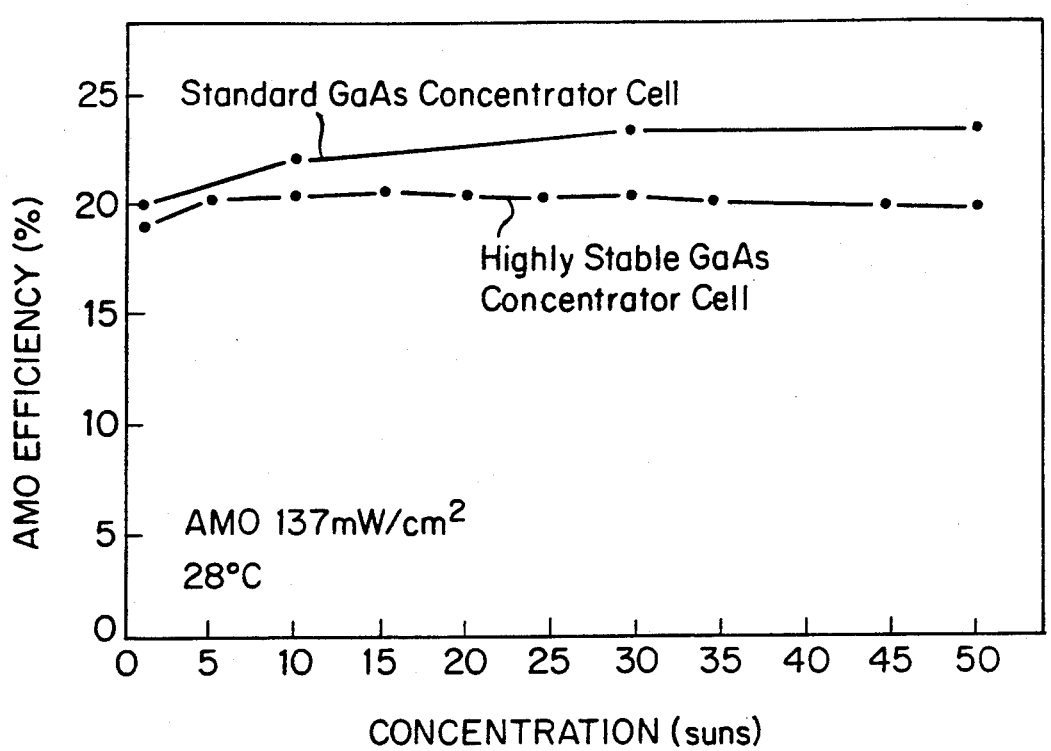
FIG. 7 is a graphical illustration plotting efficiency as a function of concentration for a conventional GaAs concentrator cell and a highly stable GaAs employing the present metallization system.
Figure 8:
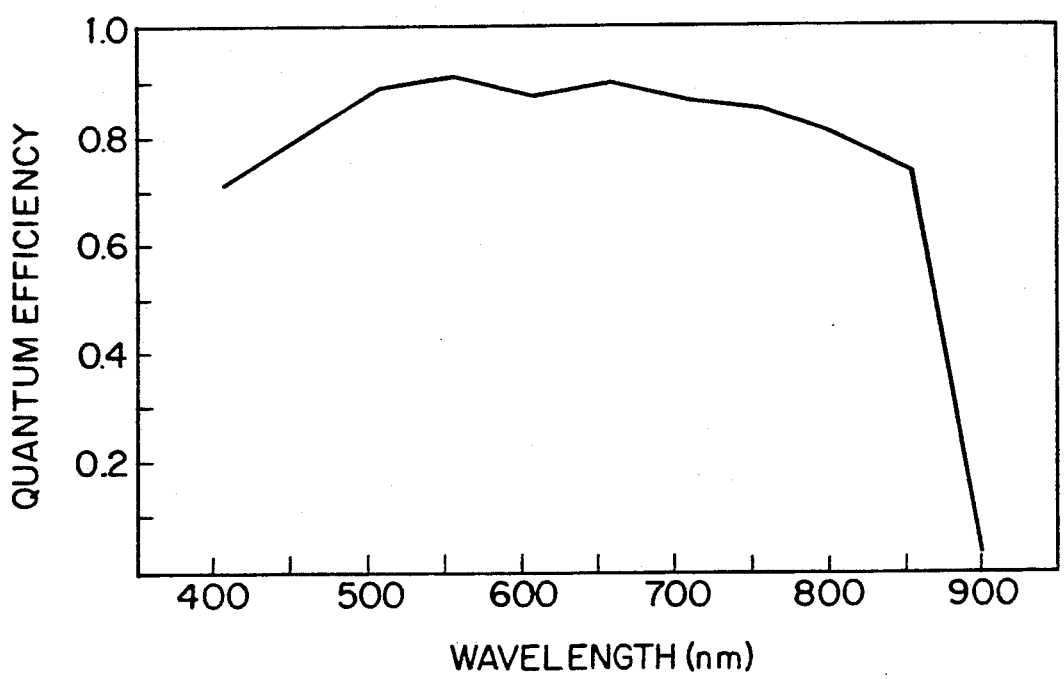
FIG. 8 is a graphical illustration plotting the quantum efficiency of a photovoltaic device of the present invention as a function of wavelength.

The efficiency of standard low temperature cells is compared to that of high temperature cells in FIG. 7, which indicates performance as a function of concentration. The design operating point for these cells is 30 suns. Typical one-sun AMO efficiency of the high temperature cells is over 18%; the cell shown in FIG. 7 yields 20% at 30 suns (28° C.). The best AMO efficiency obtained on a standard concentrator is 23% (28° C.). A typical quantum efficiency curve is shown in FIG. 8.

To determine the stability of both the conventional and the high temperature concentrator cells, devices of both types were cycled in a tube furnace. To make this test, flowing Argon in several cells of each type were subjected to 350° C. for 5 minutes and retested. The cells were then cycled to progressively higher temperatures, in 50° C. increments, and retested after each 5 minute cycle.

Figure 9:
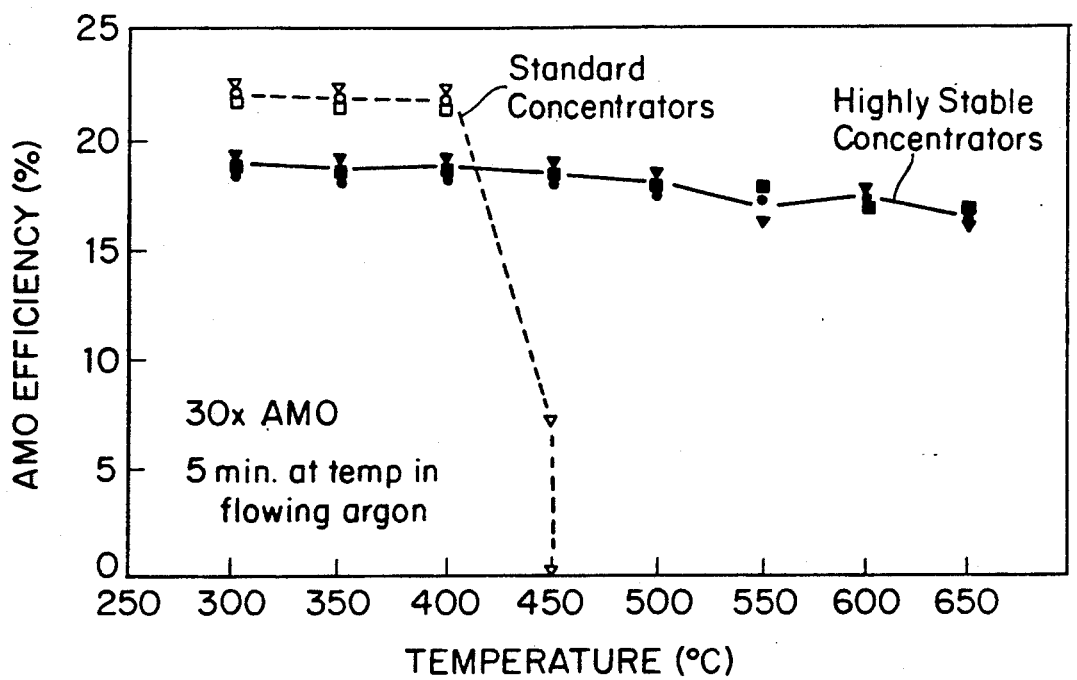
FIG. 9 is a graphical representation plotting efficiency as a function of temperature for two conventional GaAs concentrator cells and three stable concentrator cells employing the present metallization system.
Figure 10:
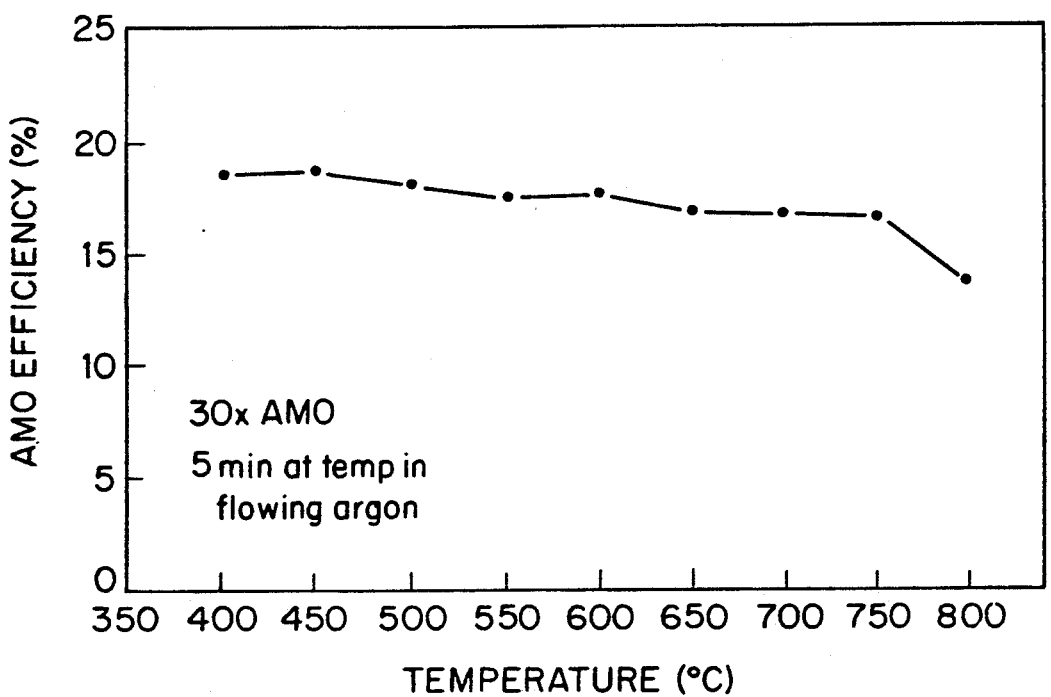
FIG. 10 is a graphical illustration plotting efficiency as a function of temperature for a stable metallized contact cell which has been cycled to 800° C.

The 30 sun AMO efficiency of both conventional and highly stable cells, as a function of cycle temperature, is shown in FIG. 9, with the progression carried to 800° C. The cell shows a change of less than 10%, even after a cycle to 700° C. Note that after this 700° C. cycle, the cell has been at or above 600° C. for 15 minutes. Similar results are obtained by cycling in vacuum.

Figure 11:
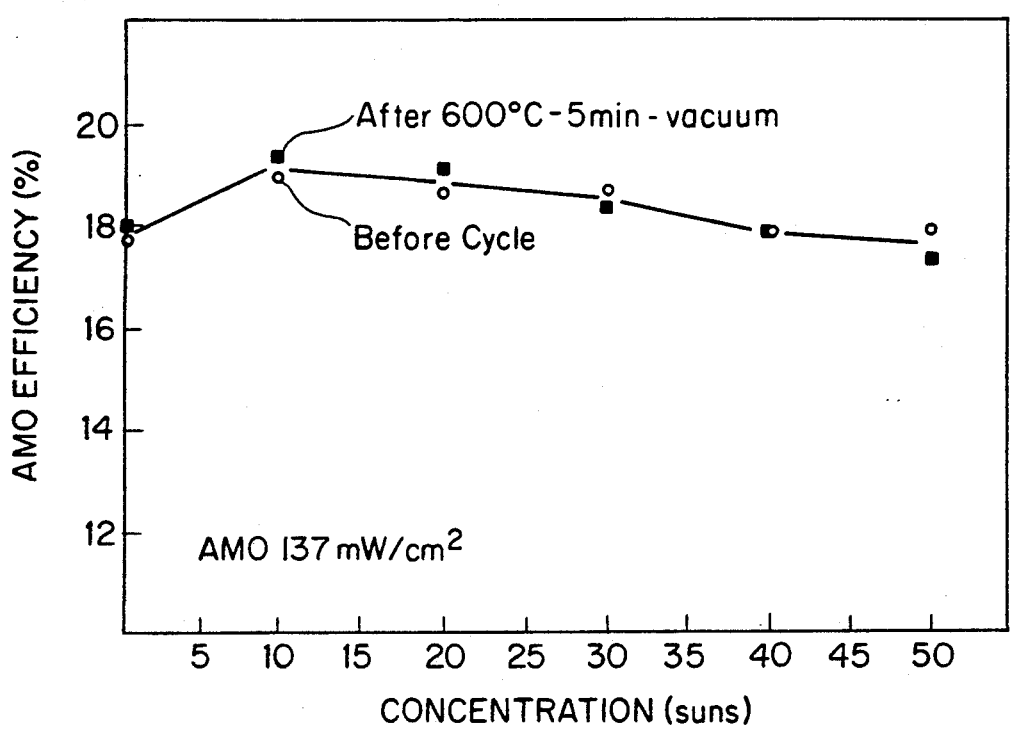
FIG. 11 is a graphical illustration plotting efficiency as a function of concentration for a concentrator cell of the present invention before and after thermal cycling without interconnects bonded to the cell.
Figure 12:
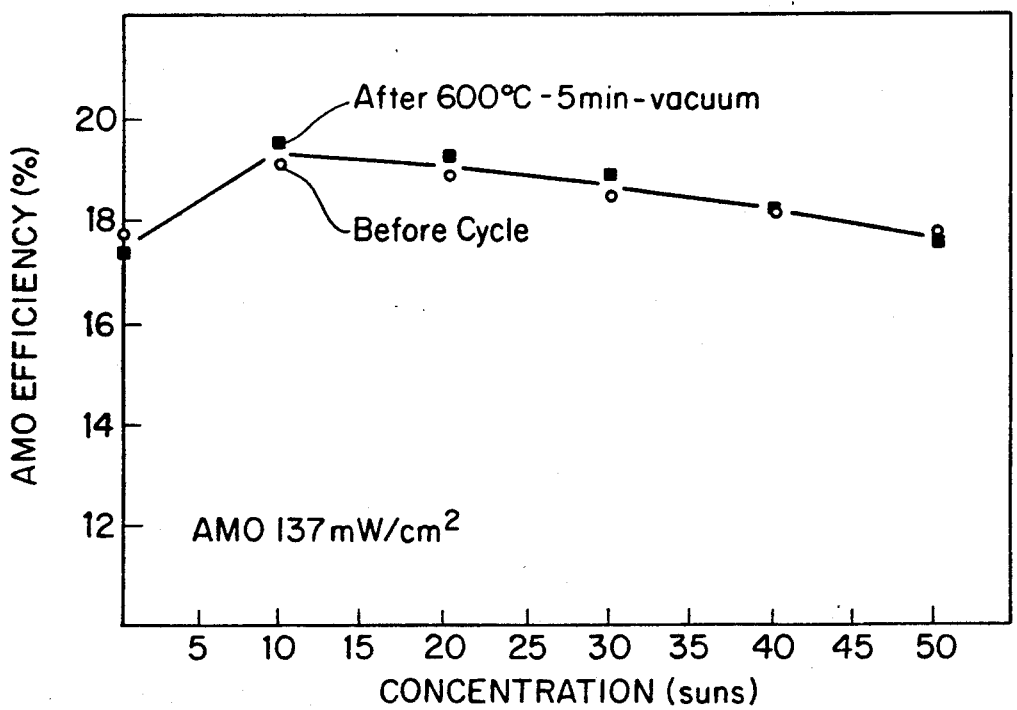
FIG. 12 is a graphical illustration plotting efficiency as a function of concentration for a concentrator cell before and after thermal cycling with interconnects bonded to the bonding pads on the front of the cell.

In order to demonstrate that the formation of interconnects does not affect the temperature stability of these cells, we first bonded leads to the front of the cell, and then cycled the cell and a non-interconnected control cell in vacuum, using a strip heater setpoint of 722° C. We show in FIGS. 11 and 12 the performance of the cell as a function of concentration before and after the cycle. Similar results have been obtained with tube furnace cycling. FIG. 11 indicates the efficiency of the cell with interconnects; FIG. 12 shows the efficiency of a control without interconnects. It can be seen that the efficiency actually improves with this cycle. The layers retained good adhesion after the temperature cycling.

We claim:

1. A contact metallization system for electrically contacting a III-V semiconductor material comprising:
   a semiconductor surface of a III-V semiconductor body having non-planar regions formed thereon;
   a diffusion barrier layer formed over the semiconductor surface and said non-planar regions such that diffusion of material between the semiconductor surface and an overlying conductor is reduced; and
   a patterned conductor formed on the barrier layer and in conductive contact with the semiconductor surface through the barrier layer, the conductor having separated portions which do not overly the non-planar regions, such that current is transported between separated portions of the patterned conductor across said non-planar regions, through the barrier layer.

2. The contact metallization system of claim 1 wherein said non-planar regions comprise an insulator formed over the semiconductor.

3. The contact metallization system of claim 1 wherein the III-V semiconductor body comprises gallium arsenide.

4. The contact metallization system of claim 1 wherein the metallization system comprises a grid for a photovoltaic device.

5. The contact metallization system of claim 4 wherein the grid collects current from a solar cell comprising gallium arsenide.

6. A contact metallization system for electrically contacting a semiconductor material comprising:
   a semiconductor surface of a semiconductor body having non-planar regions formed thereon;
   a diffusion barrier layer formed over the semiconductor surface and said non-planar regions such that diffusion of material between the semiconductor surface and an overlying conductor is reduced; and
   a patterned conductor formed on the barrier layer and in conductive contact with the semiconductor surface through the barrier layer, the conductor having separated portions which do not overly the non-planar regions, such that current is transported between separated portions of the patterned conductor across said non-planar regions, through the barrier layer.

7. The contact metallization system of claim 6 wherein the metallization contacts a light incident surface of a photovoltaic device.

8. The contact metallization system of claim 6 wherein the metallization system comprises a collection grid for a solar cell.

9. The contact metallization system of claim 6 wherein said non-planar regions comprise an insulator formed over the semiconductor body.

10. The contact metallization system of claim 6 wherein the semiconductor body comprises a mesa structure.

* * * * *